United States Patent
Kim et al.

(10) Patent No.: US 7,427,558 B2
(45) Date of Patent: Sep. 23, 2008

(54) METHOD OF FORMING SOLDER BALL, AND FABRICATING METHOD AND STRUCTURE OF SEMICONDUCTOR PACKAGE USING THE SAME

(75) Inventors: Jae-Hong Kim, Cheonan-si (KR);
Heui-Seog Kim, Cheonan-si (KR);
Wha-Su Sin, Cheonan-si (KR);
Jong-Keun Jeon, Cheonan-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 297 days.

(21) Appl. No.: 11/070,212

(22) Filed: Mar. 3, 2005

(65) Prior Publication Data
US 2006/0057833 A1  Mar. 16, 2006

(30) Foreign Application Priority Data
Sep. 13, 2004  (KR) ................ 10-2004-0072992

(51) Int. Cl.
*H01L 21/44* (2006.01)

(52) U.S. Cl. .................. 438/613; 438/617; 438/612; 257/E21.508

(58) Field of Classification Search .............. 438/123, 438/612, 617, 611, 613; 257/E21.508
See application file for complete search history.

(56) References Cited

U.S. PATENT DOCUMENTS

| | | | | |
|---|---|---|---|---|
| 5,172,851 | A | * | 12/1992 | Matsushita et al. ...... 228/180.22 |
| 5,908,317 | A | * | 6/1999 | Heo ........................... 438/617 |
| 6,028,011 | A | * | 2/2000 | Takase et al. .............. 438/745 |
| 6,214,156 | B1 | * | 4/2001 | Takano et al. .............. 156/299 |
| 6,268,662 | B1 | * | 7/2001 | Test et al. .................. 257/784 |
| 6,522,017 | B2 | * | 2/2003 | Horiuchi et al. ............ 257/778 |
| 2005/0133571 | A1 | * | 6/2005 | Chuang .................... 228/180.5 |

FOREIGN PATENT DOCUMENTS

| | | |
|---|---|---|
| JP | 07-204870 A | 8/1995 |
| JP | 10-125727 A | 5/1998 |
| JP | 10-242148 | 9/1998 |
| JP | 2003-332372 A | 11/2003 |

* cited by examiner

*Primary Examiner*—Scott B. Geyer
*Assistant Examiner*—Seahvosh J Nikmanesh
(74) *Attorney, Agent, or Firm*—Harness, Dickey & Pierce

(57) ABSTRACT

A method of forming solder balls may involve forming bumps through wire boding on land patterns of a circuit substrate. Solder cream may be applied to the bumps through screen printing. The solder cream may be melted via reflow to form solder balls in which the bumps are embedded.

20 Claims, 4 Drawing Sheets

METHOD OF FORMING SOLDER BALL, AND FABRICATING METHOD AND STRUCTURE OF SEMICONDUCTOR PACKAGE USING THE SAME

PRIORITY STATEMENT

This U.S. non-provisional application claims benefit of priority under 35 U.S.C. §119 of Korean Patent Application No. 2004-72992, filed on Sep. 13, 2004, the entire contents of which are incorporated herein by reference.

BACKGROUND OF THE INVENTION

1. Field of the Invention

The present invention relates generally to a method of fabricating semiconductor packages and, more particularly, to a method of forming solder balls of semiconductor packages and semiconductor package structures using the same.

2. Description of the Related Art

Integrated circuit devices may be fabricated on a semiconductor wafer, cut into chips, assembled into packages, and utilized in electronic products. Semiconductor packages may support the integrated circuit (IC) chips physically, protect them from the influence of external environment, and provide electrical connection paths to the IC chips. Packaging technology may affect the price, performance, and/or reliability of a semiconductor product.

Various types of semiconductor packages are well known in this art. In one example semiconductor package, IC chips may be attached on one surface of a circuit substrate and solder balls acting as external terminals of the package may be mounted on another surface. Providing a solder ball arrangement on a surface of a circuit substrate may allow for increases in the number of input/output pins and the packaging density, and reductions in electrical signal paths, for example.

Solder ball attaching techniques are well known in this art. According to one conventional method, flux may applied to land patterns on the circuit substrate. Solder balls may be attached on the flux using a ball attaching apparatus. The solder balls may be melted via reflow and attached on the land patterns.

Although conventional solder ball attaching techniques are generally thought to be acceptable, they are not without shortcomings. For example, failures in solder ball attachment may occur. The solder balls may be furnished on the surface of the flux-applied land patterns using an automated apparatus. The likelihood of solder ball attachment failure may increase as the solder ball size is decreased to about 0.3-0.4 mm in diameter, for example. Further, the likelihood of solder ball attachment failure may increase as the number of solder balls is increased into the hundreds and even thousands, for example.

In the case of a ball pitch of less than or equal to 0.3 mm, for example, ball short circuit problems may occur due to a flux overflow phenomenon. The flux, which may be of a low viscosity and water-soluble, may tend to spread out of the land patterns. Therefore, portions of the flux applied to neighboring land patterns may stick together, and this may lead to short circuits between the solder balls, where the solder balls melted via reflow may contact each other.

Ball deformation problems may occur. During flux application, uneven flux may be skewed to one side of the land pattern. Uneven flux may cause the solder balls melted via reflow to be deformed.

Further, a layer of intermetallic compounds, resulting from metallic reaction and diffusion between a land pattern constituent (e.g., copper (Cu)) and a solder ball constituent (e.g., tin (Sn)), may adversely effect electrical reliability.

SUMMARY OF THE INVENTION

Example, non-limiting embodiments of the present invention may avoid shortcomings associated with conventional solder ball forming techniques.

According to an example embodiment of the present invention a method of forming solder balls may involve bonding a wire to land patterns of a circuit substrate to form bumps on the land patterns. A solder cream may be applied over the bumps. The solder cream may be melted to form solder balls in which the bumps are embedded.

According to another example, non-limiting embodiment of the present invention, a method may involve connecting a wire to a land of a substrate. The wire may be cut to leave a portion of the wire on the substrate. A solder material may be applied to the portion of the wire. The solder material may be melted to form a composite solder bump in which the portion of the wire is embedded in the solder material.

According to another example, non-limiting embodiment of the present invention, a method may involve wire bonding an end of a wire to a land of a substrate. A solder material may be applied to the end of the wire. The solder material may be melted.

BRIEF DESCRIPTION OF THE DRAWINGS

FIG. 1 is a sectional view showing a semiconductor package before a solder ball forming process.

FIG. 2 is a sectional view showing bumps formed on land patterns via wire bonding.

FIG. 3 is a sectional view showing solder cream applied over the bumps via screen print.

FIG. 4 is a sectional view showing solder creams formed on the land pattern so as to embed the bumps after screen print.

FIG. 5 is a sectional view showing solder balls formed during a reflow technique.

DETAILED DESCRIPTION OF EXAMPLE EMBODIMENTS OF THE PRESENT INVENTION

Example, non-limiting embodiments of the present invention will now be described more fully with reference to the accompanying drawings. This invention may, however, be embodied in many different forms and should not be construed as limited to the disclosed example embodiments.

It is to be appreciated that the Figures are not drawn to scale. Rather, for simplicity and clarity of illustration, the dimensions of some components are exaggerated relative to other elements. Further, a layer is considered as being formed "on" another layer or a substrate when formed either directly on the referenced layer or the substrate or formed on other layers or patterns overlaying the referenced layer. The same reference number is given to the same or corresponding component in the various figures.

Figure 1:
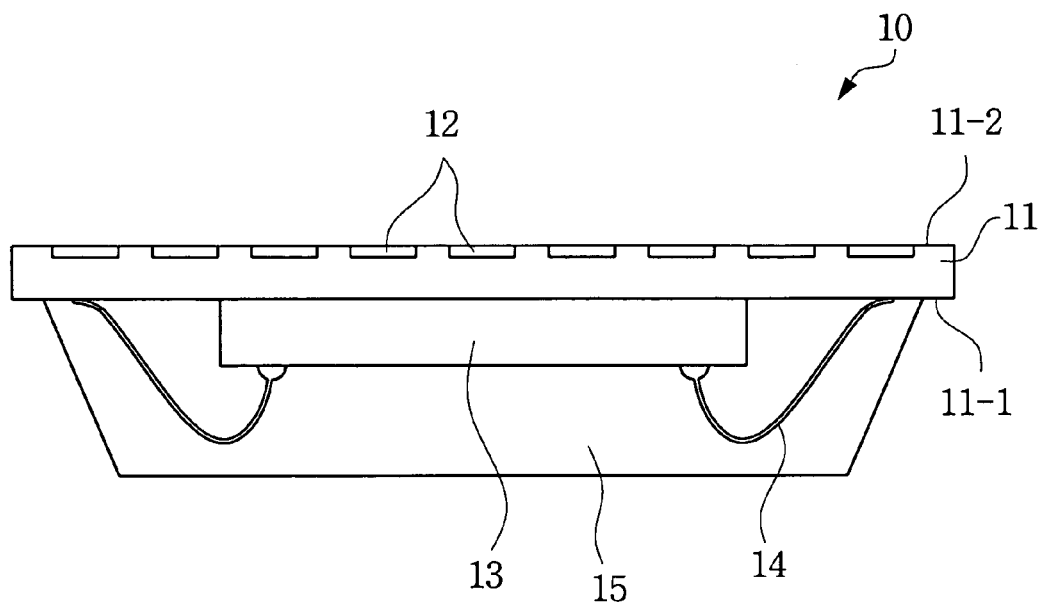
FIGS. 1 to 5 are schematic views of a method of forming solder balls according to an example embodiment of the present invention.

A method of forming solder balls according to an example, non-limiting embodiment of the present invention is shown in FIGS. 1 to 5. FIG. 1 is a sectional view showing a semiconductor package 10 prior to the solder ball forming process.

Referring to FIG. 1, the semiconductor package 10 may include a circuit substrate 11. By way of example only, and not as a limitation of the invention, the circuit substrate may be a printed circuit board or a polyimide tape, for example. The circuit substrate 11 may have a first surface 11-1 and a second surface 11-2 opposite to the first surface 11-1. A plurality of land patterns 12 may be formed in a plane array shape on the second surface 11-2.

The land patterns 12 may provide locations for the formation of solder balls, which may act as external terminals of the package 10. The land patterns 12 may be fabricated from copper (Cu), and may be plated with gold (Au). The invention is not, however, limited in this regard since the land patterns 12 may be fabricated from numerous other suitable materials, as is well known in this art. A solder mask (not shown) may be formed on the second surface 11-2 of the circuit substrate 11 (leaving at least portions of the land patterns 12 exposed), and the land patterns 12 may be formed as either a Solder Mask Defined (SMD) type or a Non-Solder Mask Defined (NSMD) type, for example. Solder masks, SMD land patterns, and the NSMD land patterns are well known in this art, and therefore a detailed description of the same is omitted. Additionally, ridges and furrows may be formed on the surfaces of the land patterns 12 to increase connection area with the solder balls.

IC chips 13 may be attached on the first surface 11-1 of the circuit substrate 11 through a conventional chip attaching processes. The IC chips 13 may be electrically connected to the circuit substrate 11 via metal wires 14, for example, via a conventional wire bonding process. Also, the IC chips 13 and the metal wires 14 may be sealed within a sealing resin 15 via a conventional molding process.

Figure 6A:
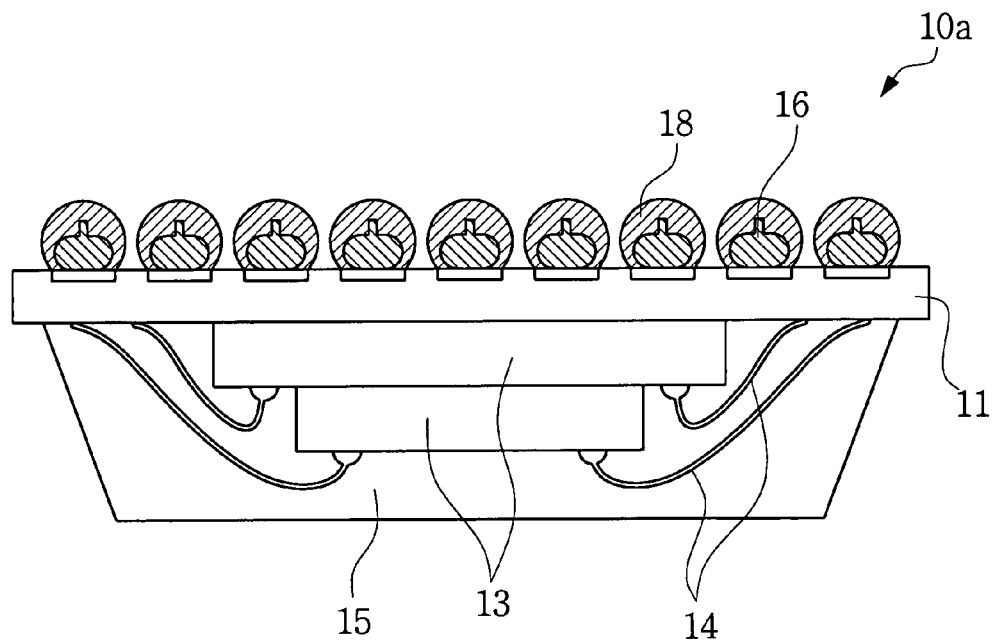
FIGS. 6A to 6C are sectional views showing example semiconductor packages having solder balls that may be fabricated using the example method illustrated in FIGS. 1-5.
Figure 6B:
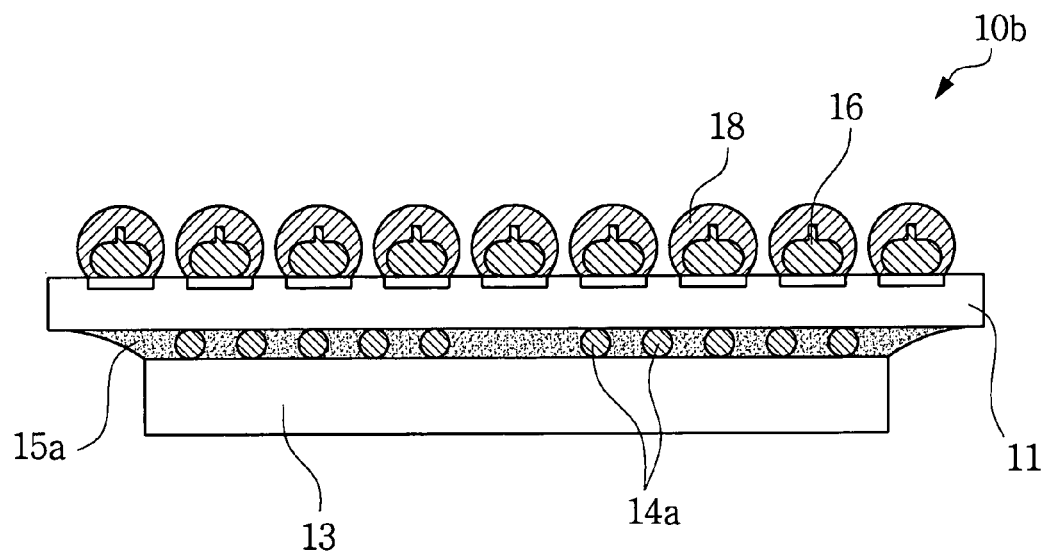
Figure 6C:
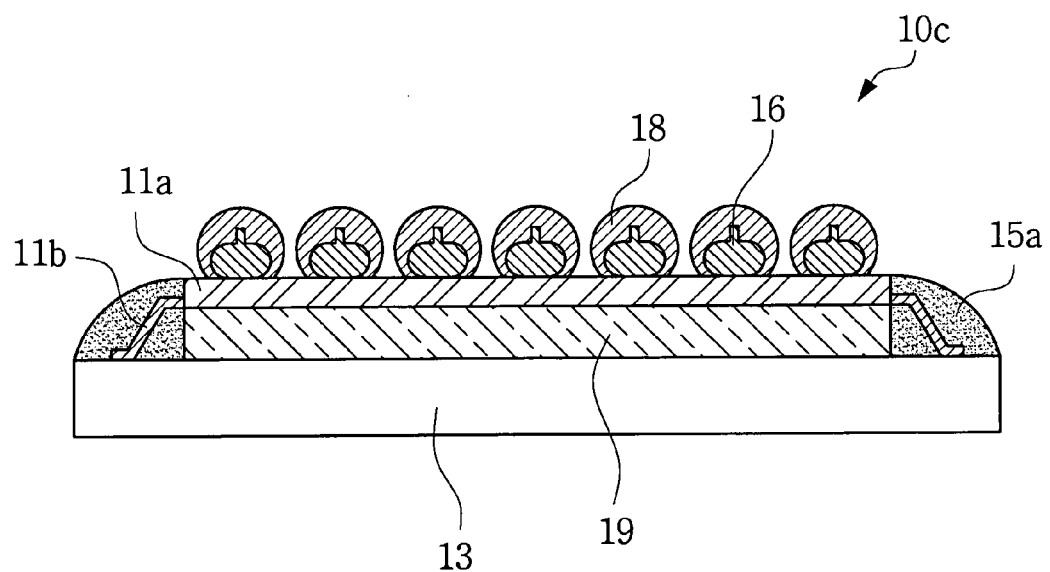

FIG. 1 illustrates one example structure of the package 10 to which example embodiments of the present invention may be applied. The invention, however, is not limited to the package details depicted in FIG. 1. More specifically, the packages that may be implemented on the first surface 11-1 of the circuit substrate 11 may be of a variety of alternative structures and types. Some alternative semiconductor package types to which example embodiments of the present invention may be applied are illustrated in FIGS. 6A to 6C, and will be explained later.

Figure 2:
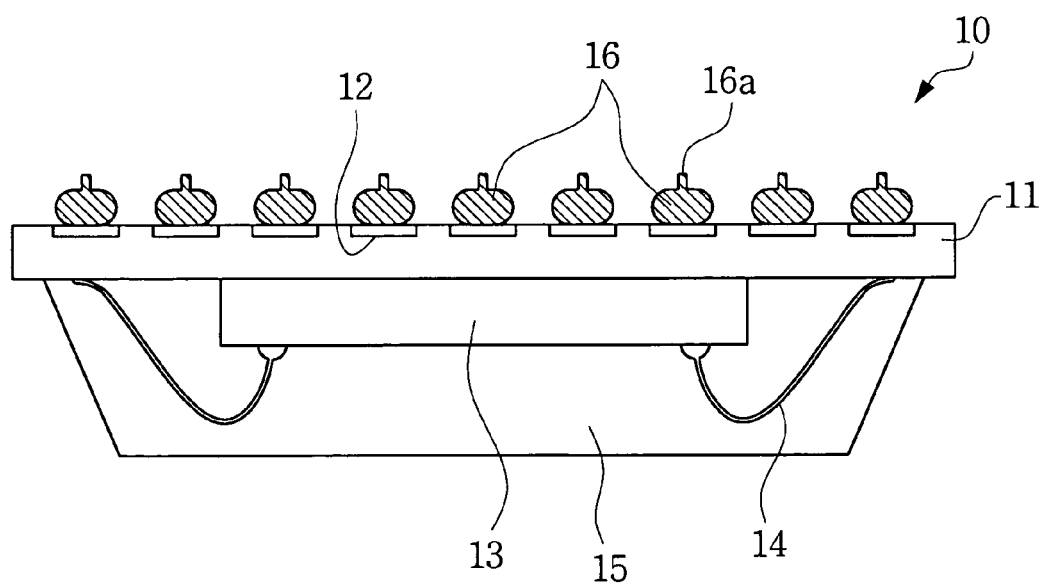

FIG. 2 is a sectional view showing bumps 16 that may be formed on the land patterns 12 via wire bonding techniques. The bumps 16 may be formed on the land patterns 12 before solder balls are formed. The bumps 16 may be formed via a ball bonding process. The ball bonding process may involve forming a ball bond by connecting a ball formed on the end of a metal wire to the land pattern 12, and then cutting the metal wire above the ball bond. Ball bonding techniques (inclusive of forming a ball on the end of a wire, connecting the ball to a bond site, and cutting the wire) are well known in the relevant art, and therefore detailed explanations thereof are omitted. Further, the invention is not limited to the ball bonding process since other wire bonding techniques may be suitably implemented. For example, the wire bonding may be carried out via a stitch bonding process.

The size of the bumps 16 may depend upon, for example, the size and the pitch of the solder balls to be formed. The size of the bumps 16 may also depend upon factors such as (for example) the diameter of the metal wire used for wire bonding, the diameter of the ball formed at the end of the metal wire, and the existence of wire tails 16a that may be created by the wire cutting. The metal wires utilized to form the bumps 16 may be fabricated from conductive materials, such as gold (Au) and copper (Cu). It will be appreciated, however, that the metal wires may be fabricated from numerous other alternative materials, as is well known in this art. The metal wire utilized to form the bumps 16 may be larger in diameter than the metal wires 14 that may electrically connect the IC chips 13 to the circuit substrate 11. It will be appreciated, however, that the invention is not limited in this regard as the metal wire utilized to form the bumps 16 may have a diameter that is equal to or less than the diameter of the wires 14. By way of example only, and not as a limitation of the invention, if the diameter of the metal wires 14 is about 25 µm, then the diameter of the metal wires utilized to form the bumps 16 may be about 50 µm and the diameter of the ball created by the wire bonding may be about 150 µm.

Figure 3:
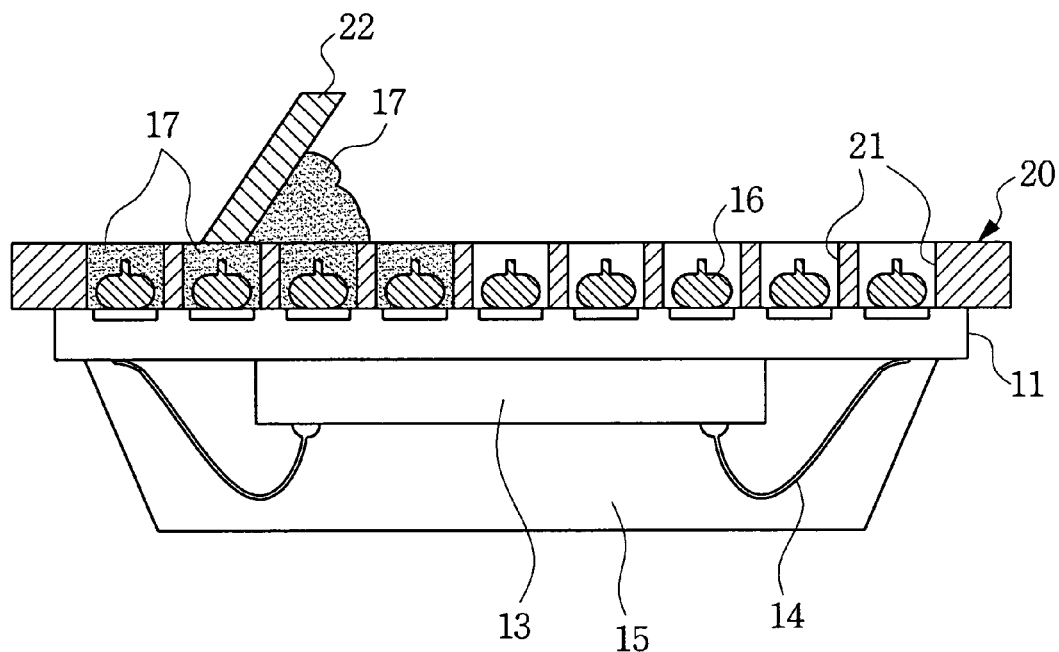

FIG. 3 is a sectional view showing an example procedure for applying a solder cream 17 to the bumps 16. By way of example only, and not as a limitation of the invention, the solder cream 17 may be applied via a screen printing technique.

In FIG. 3, a screen mask 20 may be provided on the second surface of the circuit substrate 11. The screen mask 20 may have a plurality of openings 21, which may be formed so as to correspond to the arrangement of the land patterns 12. Thus, when the screen mask 20 is situated on the second surface of the circuit substrate 11, the bumps 16 may be located within the openings 21, respectively. The diameter of the openings 21 may be greater than that of the bumps 16, and may be set to be either less than that of the SMD type land patterns or greater than that of NSMD type land patterns.

In the illustrated embodiment, the openings 21, the bumps 16, and the land patterns 12 may have a circular shape, but the invention is not limited in this regard. For example, the openings 21, the bumps 16, and land patterns 12 may be of alternative geometrical shapes, as well as different shapes with respect to each other (e.g., the openings 21 may have a square shape, the bumps 16 may have an oval shape, and the land patterns 12 may have a triangular shape). Further, in the illustrated embodiment, the openings 21 may have the same general shape, the bumps 16 may have the same general shape, and the land patterns 12 may have the same general shape, but the invention is not limited in this regard. For example, the openings 21 of a given mask 20 may have different shapes, the bumps 16 on a given circuit substrate 11 may have different shapes, and/or the land patterns 12 on a given circuit substrate 11 may have different shapes.

The solder cream 17 may be pushed into the openings 21 using a squeegee 22, for example. The solder cream 17 may be a mixture of solder paste and the flux. The viscosity of the solder cream 17 may be greater than that of the flux. As is well known in this art, the flux may remove impurities from the land patterns 12, and may facilitate the connection of the solder balls to the land patterns 12. The solder paste may be a base material of solder particles. By way of example only, and not as a limitation of the invention, the solder paste may be a combination of Tin (Sn) and lead (Pb) at a ratio of about 60 to 40 or 63 to 37, for example. Numerous and varied solder paste materials and flux materials are well known in this art, and therefore a detailed discussion of the same is omitted.

Figure 4:
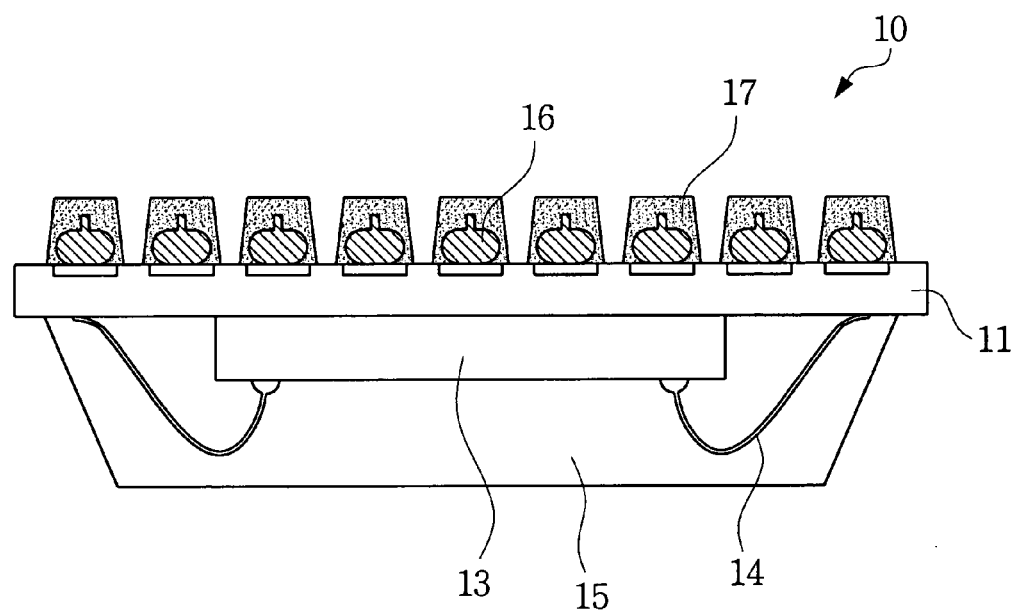

The screen mask 20 may be removed, as shown in FIG. 4. Here, the solder cream 17, embedding the wire ball bumps 16, may be formed on the land patterns 12. The invention is not limited to any particular shape of the formed solder cream 17.

Figure 5:
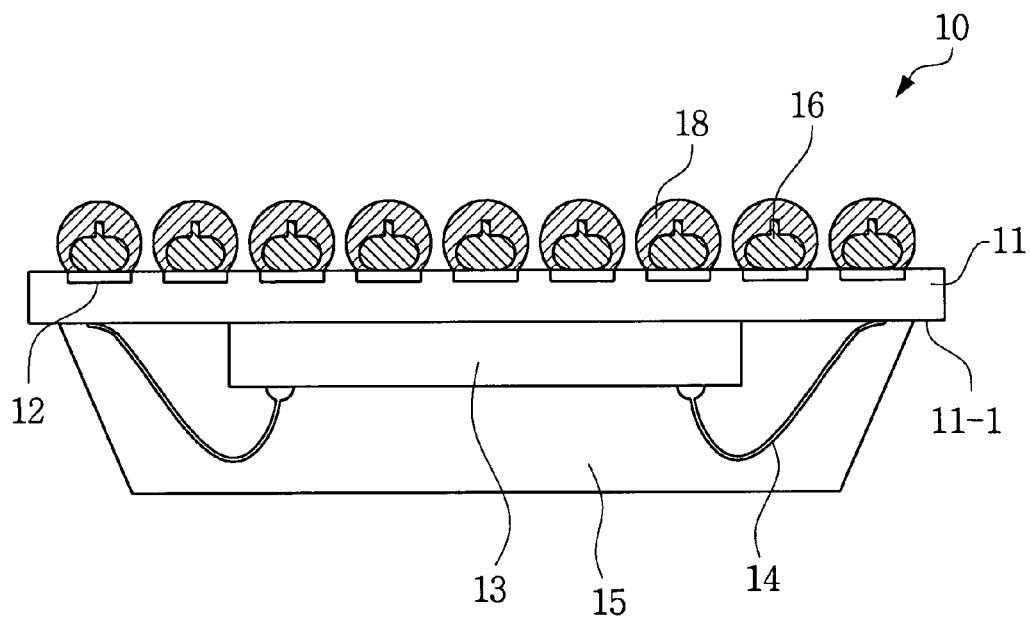

As shown in FIG. 5, solder balls 18 embedding the wire ball bumps 16 may be formed by melting the solder cream 17 via a reflow technique. The reflow temperature may be set to be higher than the melting temperature of the solder particles. For instance, a solder paste having a ratio of Sn 63 to Pb 37 may have a melting temperature of about 183° C., and the reflow temperature may be set to about 210° C. It will be appreciated, however, that numerous and alternative reflow temperatures may be suitably implemented. Also, the illustrated solder balls 18 may have a spherical shape, but the invention is not limited in this regard.

The example method described above may reduce the ball attachment failures experienced using conventional manufacture methods. This may be attributable, at least in part, to the solder balls 18 being formed by applying the solder cream 17 onto the bumps 16. Also, as compared to conventional methods, short circuits between solder balls and solder ball deformations that may be attributable to the overflow and skewness of the flux may be reduced because the solder cream 17 may contain the flux. Consequently, the method of forming solder balls according to an example embodiment of the present invention may be suitable for implementing a finer ball pitch. For instance, it may be possible to implement a ball pitch of about 0.1 mm. Further, the example method may be implemented without additional investments because the equipment and process for the wire bonding may already be employed in the conventional fabricating method for semiconductor packages. In addition, the bumps 16 may not increase the solder ball pitch because conventional wire bonding processes may implement a pad pitch of about 50 μm, for example.

In addition, the solder balls 18 embedding the bumps 16 may improve the reliability of solder ball connection. Namely, the solder balls 18 may have better resistance against external fatigue. This may decrease the deformation of balls caused by the accumulation of fatigue, and may reduce the separation of the solder balls 18 from the land patterns 12 in succeeding processes such as package stacking. In addition, the bumps 16 may reduce the intermetallic reaction and diffusion between the constituents of the land patterns 12 and the solder ball 18, which may lead to highly increased electrical reliability.

The method of forming solder balls according to example embodiments of the present invention may be applied to various types of semiconductor packages. FIGS. 6A to 6C are sectional views showing some (but certainly not all) of the types of semiconductor packages to which example embodiments of the present invention may be applied.

It is possible to apply embodiments of the present invention to the chip stack package 10a illustrated in FIG. 6A. Here, two or more integrated circuit chips may be stacked on the first surface of the circuit substrate 11.

It is also possible to apply embodiments of the present invention to the flip chip package 10b illustrated in FIG. 6B. Here, an IC chip 13, which may be turned upside down, may be attached to the first surface of the circuit substrate 11. In this case, the IC chip 13 and the circuit substrate 11 may be electrically connected via metal bumps 14a, and sealing resin 15a may be filled therebetween.

It is also possible to apply embodiments of the present invention to the packages 10c, which may be referred to as chip size packages (CSP), as illustrated in FIG. 6C. Here, the circuit substrate may be in the form of a polyimide tape 11a and circuit leads 11b. The circuit leads 11b may create direct electrical connections with the IC chips 13. The circuit leads 11b may be protected by sealing resin 15a, and an elastomer 19 may be inserted between the polyimide tape 11a and IC chips 13.

It is also possible to apply embodiments of the present invention to a variety of packages, widely known in this field, such as multi chip packages (MCP) and system in packages (SIP), for example.

While example embodiments of the invention have been shown and described in this specification, it will be understood by those skilled in the art that various changes or modifications of the embodiments are possible without departing from the spirit of the invention as defined by the appended claims.

What is claimed is:

1. A method of forming solder balls, the method comprising:
   bonding a wire to land patterns of a circuit substrate to form bumps on the land patterns;
   applying solder cream over the bumps and the land patterns; and
   melting the solder cream to form solder balls in which the bumps and the land patterns are embedded.

2. The method of claim 1, wherein the solder cream is applied through screen printing.

3. The method of claim 2, wherein the screen printing comprises:
   positioning a screen mask on the circuit substrate so that the bumps are located within openings of the screen masks; and
   pushing the solder cream into the openings such that the bumps are embedded within the solder cream.

4. The method of claim 3, wherein the openings of the screen mask are larger than the bumps.

5. The method of claim 1, wherein the bonding is a ball bonding process.

6. The method of claim 5, wherein the ball bonding process comprises:
   connecting a ball on the end of a wire to a land pattern to form a ball bond; and
   cutting the wire above the ball bond.

7. The method of claim 1, wherein the circuit substrate is a printed circuit board or a polyimide tape.

8. The method of claim 1, wherein the solder cream includes solder paste and flux.

9. A method of fabricating a semiconductor package, the method comprising:
   providing a circuit substrate having a first surface and a second surface;
   attaching an integrated circuit chip to the first surface of the circuit substrate;
   electrically connecting the integrated circuit chip to the circuit substrate; and
   forming solder balls so as to embed bumps on the second surface of the circuit substrate according to claim 1.

10. A semiconductor package fabricated using the method of claim 9.

11. A method comprising:
    connecting a wire to a land of a substrate;
    cutting the wire to leave a portion of the wire on the substrate;
    applying a solder material to the portion of the wire and the land; and
    melting the solder material to form a composite solder bump in which the portion of the wire is embedded in the solder material.

12. The method of claim 11, wherein the solder material is a solder cream applied via screen printing.

13. The method of claim 12, wherein the screen printing comprises:
    positioning a screen mask on the circuit substrate so that the portion of the wire is located within an opening of the screen mask; and
    pushing the solder cream into the opening.

14. The method of claim 11, wherein the wire is connected via a ball bonding process.

15. A method comprising:
    wire bonding an end of a wire to a land of a substrate;
    applying a solder material to the end of the wire and the land; and
    melting the solder material to form solder bumps in which the end of the wire is embedded in the solder material.

16. The method of claim 15, wherein the wire bonding is a ball bonding process.

17. The method of claim 16, wherein the ball bonding process comprises:
    connecting a ball on the end of a wire to the land pattern to form a ball bond; and
    cutting the wire above the ball bond.

18. The method of claim 15, wherein the solder material is a solder cream.

19. The method of claim 18, wherein the solder cream is a mixture of solder particles and flux.

20. The method of claim 19, wherein the solder particles are fabricated from tin and lead.

* * * * *